(12) United States Patent
Geefay et al.

(10) Patent No.: US 7,554,177 B2
(45) Date of Patent: Jun. 30, 2009

(54) ATTACHMENT SYSTEM INCORPORATING A RECESS IN A STRUCTURE

(75) Inventors: Frank S. Geefay, Cupertino, CA (US); David T. Dutton, San Jose, CA (US); Qing Bai, Sunnyvale, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 401 days.

(21) Appl. No.: 11/243,569

(22) Filed: Oct. 5, 2005

(65) Prior Publication Data
US 2007/0075402 A1    Apr. 5, 2007

(51) Int. Cl.
*H01L 29/06* (2006.01)
*H05K 1/11* (2006.01)
*H01L 21/00* (2006.01)

(52) U.S. Cl. .................. 257/622; 257/723; 361/784; 438/107

(58) Field of Classification Search ............. None
See application file for complete search history.

(56) References Cited

U.S. PATENT DOCUMENTS

| | | | | |
|---|---|---|---|---|
| 4,888,226 A * | 12/1989 | Wong | ............ | 428/76 |
| 5,157,589 A * | 10/1992 | Cole et al. | ............ | 361/795 |
| 5,329,423 A * | 7/1994 | Scholz | ............ | 361/760 |
| 5,422,150 A * | 6/1995 | Scoular et al. | ............ | 428/33 |
| 5,468,681 A * | 11/1995 | Pasch | ............ | 438/108 |
| 7,220,458 B2 * | 5/2007 | Hollis et al. | ............ | 427/446 |
| 7,319,266 B2 * | 1/2008 | St. Germain et al. | ....... | 257/676 |
| 2004/0262781 A1 * | 12/2004 | Germain et al. | ............ | 257/787 |
| 2006/0278882 A1 * | 12/2006 | Leung et al. | ............ | 257/98 |
| 2007/0045780 A1 * | 3/2007 | Akram et al. | ............ | 257/621 |

* cited by examiner

*Primary Examiner*—Alonzo Chambliss

(57) ABSTRACT

An attachment system. The attachment system includes a first structure and a second structure. The first structure has a surface and a recess in the surface. The second structure is molded into the recess and extends above the surface. The second structure adheres to the first structure at a boundary of the recess.

14 Claims, 9 Drawing Sheets

ATTACHMENT SYSTEM INCORPORATING A RECESS IN A STRUCTURE

BACKGROUND

Wafer-to-wafer bonding is an increasingly important packaging technique. Packaging typically is a major cost component of modem microelectronic devices. Wafer-level packaging provides an opportunity to achieve significant cost reductions by packaging various sensors, actuators, and/or circuits together in wafer form, thereby eliminating the cost of packaging the various chips separately. In addition, the bonding of one wafer to another can be used for various purposes other than just cost reduction. Applications of this technology include use with delicate circuits or micro-electromechanical system (MEMS) that need to be protected from particles or from mechanical damage.

Various techniques have been used to effect the bonding of one wafer to another. Generally these techniques can be classified as either (1) a direct bond, (2) an anodic bond, or (3) an intermediate layer bond. In a direct bond, wafers are placed in direct contact with each other. Such bonding techniques rely on the tendency for one smooth surface to adhere to another. The bonding occurs without significant pressure, electric fields, or intermediate layers of other materials. However, thermal annealing is used after the wafers are placed in contact with each other. For anodic bonds, the wafers to be bonded are placed in contact and then an electric field is applied between the two wafers coupled with an elevation in temperature generally to the range of 300-450 C. This type of bond is typically formed between a sodium-baring glass wafer and a silicon wafer. For intermediate layer bonds, an intermediate layer is required to form the wafer-to-wafer bond. Materials used in such bonds include eutectics, polymers, and solders. For polymers the current practice is either to place some material or adhesion promoter onto the surface which improves the bonding mechanism between the polymer and the surface the polymer is being placed. Often the surface is roughened up to increase the surface area. Generally, the adhesion of the polymer is only marginally improved.

In other applications, the bonding of multiple liquid polymer layers together requires special curing processes, adhesion promoters, or geometry configurations to achieve acceptable adhesion. Typically, the adhesion of one polymer to another has been found to be either marginal or unacceptable.

SUMMARY

In representative embodiments, an attachment system is disclosed. The attachment system comprises a first structure and a second structure. The first structure has a surface and a recess in the surface. The second structure is molded into the recess and extends above the surface. The second structure adheres to the first structure at a boundary of the recess.

In another representative embodiment, a method for fabricating an attachment system is disclosed. The method comprises creating a recess in a first structure, applying a second structure to the first structure, patterning the second structure as necessary, and adhering the second structure to the first structure.

In still another representative embodiment, a method for fabricating an attachment system is disclosed. The method comprises applying a first structure to a third structure, patterning the first structure and creating a recess in the first structure, applying a second structure to the first structure, patterning the second structure as necessary, and adhering a fourth structure to the second structure.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1A:
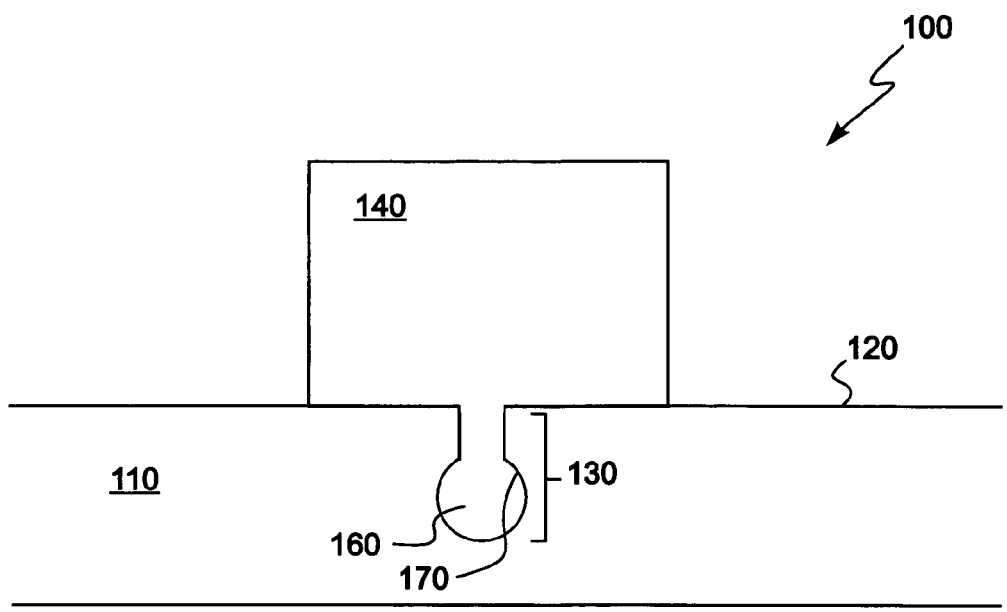
FIG. 1A is a drawing of an attachment system as described in various representative embodiments.

As shown in the drawings for purposes of illustration, the present patent document discloses novel anchoring systems. In these systems, the surface to be bonded is perforated with small, relatively shallow channels or holes. The object could be, for example, a semiconductor wafer. Adhesion can be enhanced by forming small cavities under the perforations. When a polymer, for example, is spread onto the surface or forced onto the surface under pressure and elevated temperature, a small amount of the polymer flows inside these small perforations. When the polymer solidifies that portion which flowed into the perforations and that portion which is attached to the surface of the object will remain firmly attached. The various chip-to-chip bonded structures can then be separated from each other via conventional integrated circuit die separation techniques. The polymers in these perforations anchor the rest of the polymer structure firmly to the surface regardless of how well they adhere to the original surface. In fact, adhesion strength can be increased many fold over that of conventional adhesive techniques. This significantly greater bonding strength allows marginally adhesive polymers to be used in applications they would otherwise be excluded from and creates the possibility for new applications of these inexpensive and versatile polymers. Polymers can now be made to adhere well to surfaces that normally would exclude their use.

In the following detailed description and in the several figures of the drawings, like elements are identified with like reference numerals.

FIG. 1A is a drawing of an attachment system 100 as described in various representative embodiments. In FIG. 1A, the attachment system 100, comprises a first structure 110 which has a surface 120 and a recess 130 in the surface 120. The recess 130 is also referred to herein as the perforation 130. A second structure 140 is molded into the recess 130 and extends above the surface 120. In FIG. 1A, the recess 130 comprises a cavity 160. The second structure 140 adheres to the first structure 110 at boundary 170 of the recess 130.

The first structure 110 could be a semiconductor substrate which could be, for example, silicon, gallium arsenide (GaAs), other III-V materials, glass, quartz, ceramic, or other appropriate material. The second structure 140 could be a polymer or other appropriate material which like polymers have a glass transition temperature wherein for at least one temperature greater than the glass transition temperature the second structure 140 is in a deformable state and for at least one temperature less than the glass transition temperature, the second structure 140 is in a rigid state.

Figure 1B:
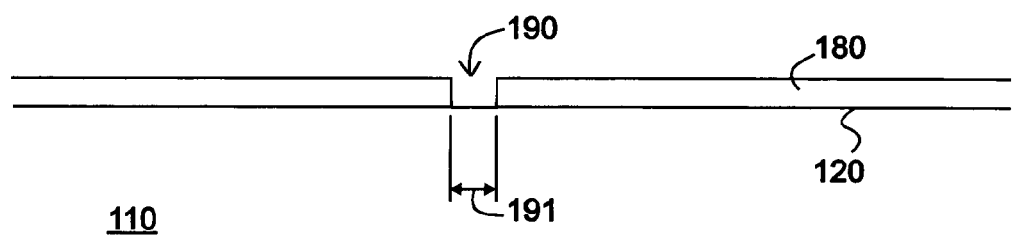
FIG. 1B is a drawing at a stage in the fabrication of the attachment system as described in various representative embodiments.

FIG. 1B is a drawing at a stage in the fabrication of the attachment system 100 as described in various representative embodiments. Standard integrated circuit processing procedures can be used in the fabrication process. In FIG. 1B, an opening 190, also referred to herein as a recess opening 190, has been opened in an etch resistant layer 180 which could be a photoresist layer 180 which was previously spun onto the first structure 110. Following application of the photoresist layer 180, the photoresist layer 180 is exposed using an appropriately patterned mask. Subsequent development of the photoresist then opens the recess opening 190 in the photoresist layer 180. Also, shown in FIG. 1B is the boundary of a projection 191 of the recess opening 190 normal to the surface 120.

Figure 1C:
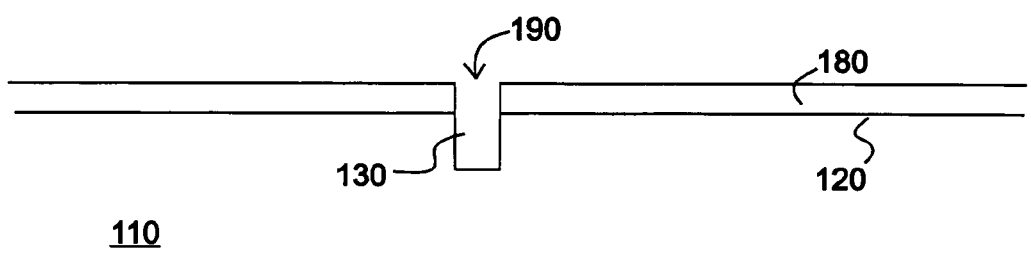
FIG. 1C is a drawing at another stage in the fabrication of the attachment system as described in various representative embodiments.

FIG. 1C is a drawing at another stage in the fabrication of the attachment system 100 as described in various representative embodiments. In FIG. 1C, the recess 130 has been created in the first structure 110 through the recess opening 190. Also, at this stage the photoresist layer 180 remains on the surface 120 of the first structure 110. A deep silicon etching process which could be, for example, the Bosch process can be used to etch the recess 130 for applications in which the first structure 110 is a silicon substrate. The Bosch process is cyclic in nature. It comprises alternating between three steps. The first of these steps is the passivation, or polymer deposition, step which covers the recess 130 and the photoresist layer 180 with a thin $C_4F_8$-based fluoropolymer. The second step is the passivation removal step which removes the polymer from the bottom of the trench. And, the third step is the silicon etch step which is a low-bias $SF_6$ etch of the exposed silicon at the bottom of the trench. This third step enables overall directional (usually vertical) progression of the etch step.

The Bosch process typically creates rough sidewalls with the roughness being a direct consequence of alternating the deposition and the etch cycles. The roughness can be reduced by including additional gases, such as oxygen or nitrogen, in the process to encourage a more anisotropic etch behavior. However, this roughened surface will have no adverse effect in this application and can even improve the adhesion of the polymer to the sidewalls.

Figure 1D:
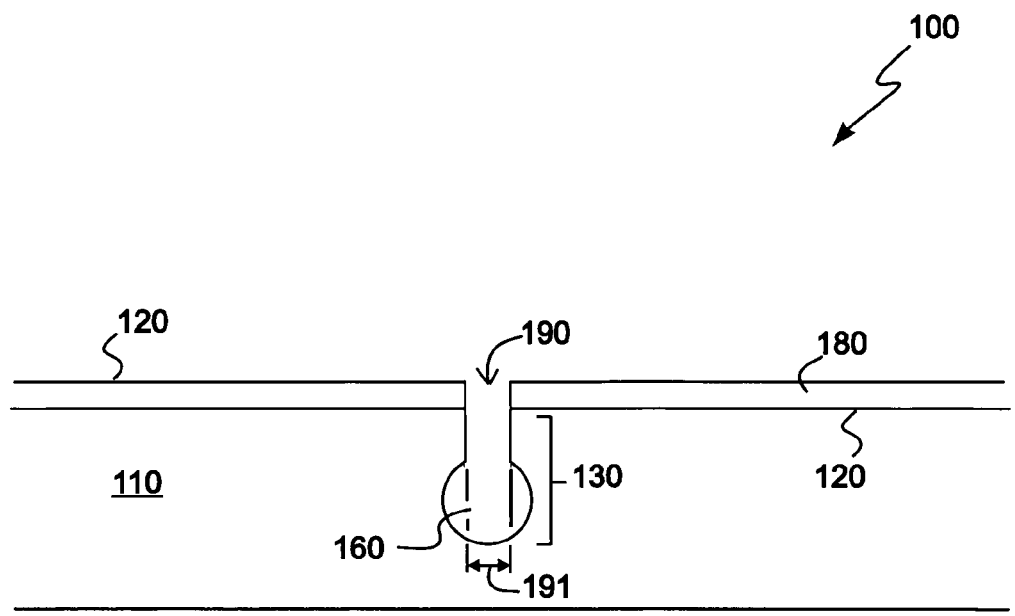
FIG. 1D is a drawing at yet another stage in the fabrication of the attachment system as described in various representative embodiments.

FIG. 1D is a drawing at yet another stage in the fabrication of the attachment system 100 as described in various representative embodiments. In FIG. 1D, the plasma etch chemistry is optionally changed, for example, to that of an isotropic etch. This optional, additional etch balloons out at the bottom of the recess 130 creating the cavity 160. The extension of the recess 130 into the first structure 110 beyond the projection 191 normal to the surface 120 of recess opening 190 is optional but will improve the strength of the attachment of the second structure 140 to the first structure 110. For a typical application, the depth of the cavity 160 below the surface 120 is within 10% of the thickness of the second structure 140 above the surface of the first structure 110.

Figure 1E:
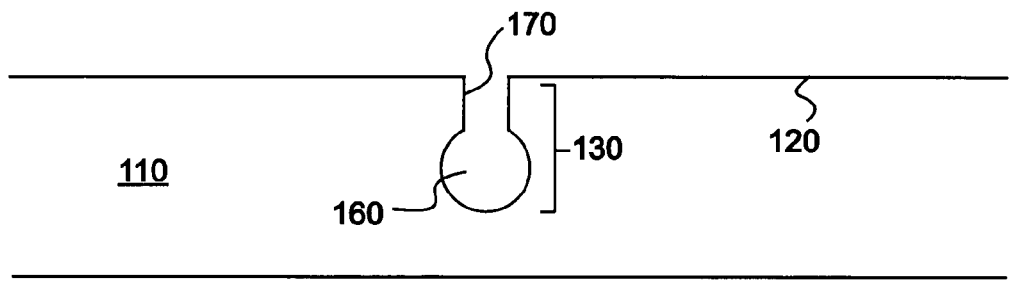
FIG. 1E is a drawing at still another stage in the fabrication of the attachment system as described in various representative embodiments.

FIG. 1E is a drawing at still another stage in the fabrication of the attachment system 100 as described in various representative embodiments. In FIG. 1E, the photo resist has been removed exposing the surface 120 of the first structure 110.

Figure 1F:
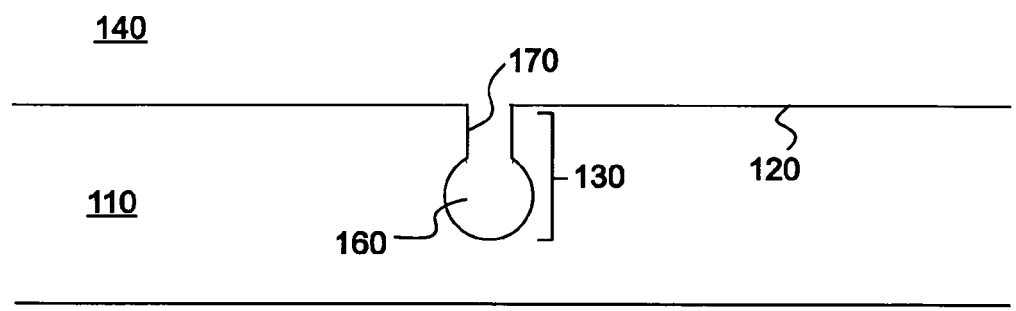
FIG. 1F is a drawing at yet still another stage in the fabrication of the attachment system as described in various representative embodiments.

FIG. 1F is a drawing at yet still another stage in the fabrication of the attachment system 100 as described in various representative embodiments. In FIG. 1F, the second structure 140 is applied to the first structure 110. The second structure 140 is typically a polymer which is coated onto the surface 120 and baked to dry and harden or pressed onto the surface 120 at elevated temperature. The polymer in both instances is in a fluid or plastic state allowing it to flow into the previously etched recess 130 which in FIG. 1F comprises the cavity 160.

Following the actions resulting in the configuration of FIG. 1F, the second structure (the polymer) 140 is patterned to define the shape of the polymer at the surface 120 and etched or otherwise shaped using standard processing techniques. Additional steps such as curing may be needed depending upon the material used to further harden the polymer. The result of these steps is as shown in FIG. 1A.

Figure 1G:
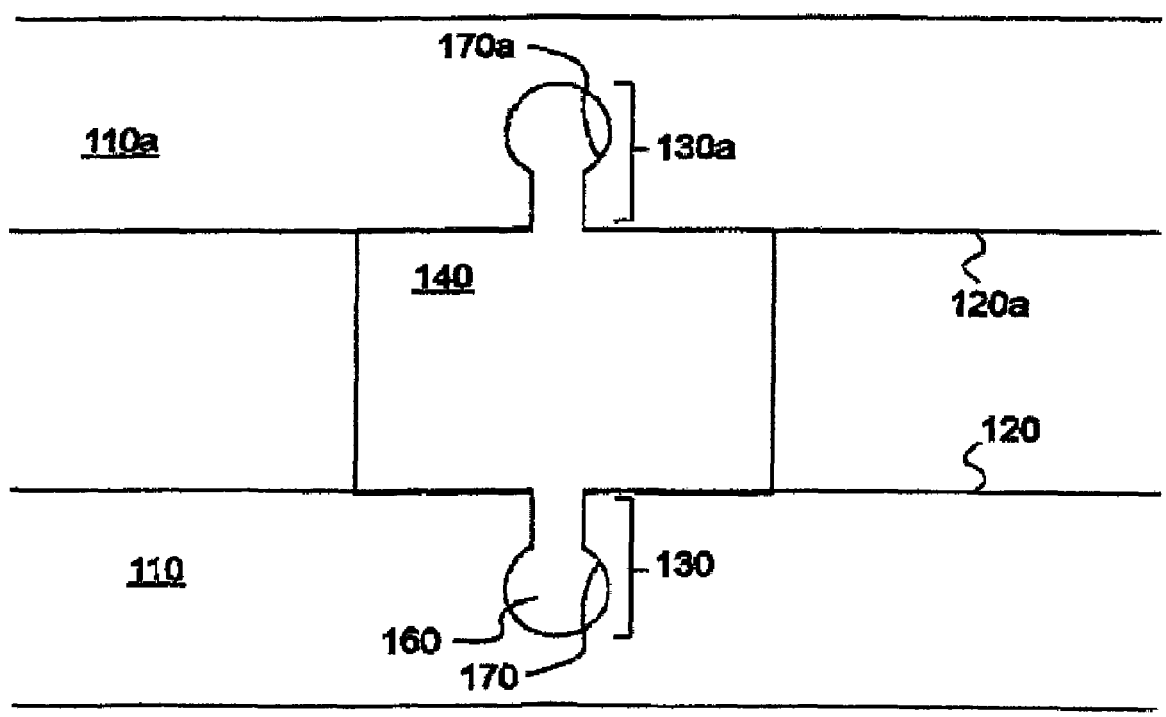
FIG. 1G is a drawing of an application of the attachment system of FIG. 1A.

FIG. 1G is a drawing of an application of the attachment system 100 of FIG. 1A. In FIG. 1G, the attachment system 100 further comprises an additional first structure 110a. The additional first structure 110a has a surface 120a and a recess 130a in the surface 120a of the additional first structure 110a. The second structure 140 is further molded into the recess 130a of the additional first structure 110a and extending below the surface 120a of the additional first structure 110a. The second structure 140 is further adhered to the additional first structure 110a at boundary 170a of the recess 130a of the additional first structure 110a thereby anchoring the additional first structure 110a to the first structure 110.

Figure 2A:
FIG. 2A is a drawing of a top view of a recess opening in the first structure as described in various representative embodiments.
Figure 2B:
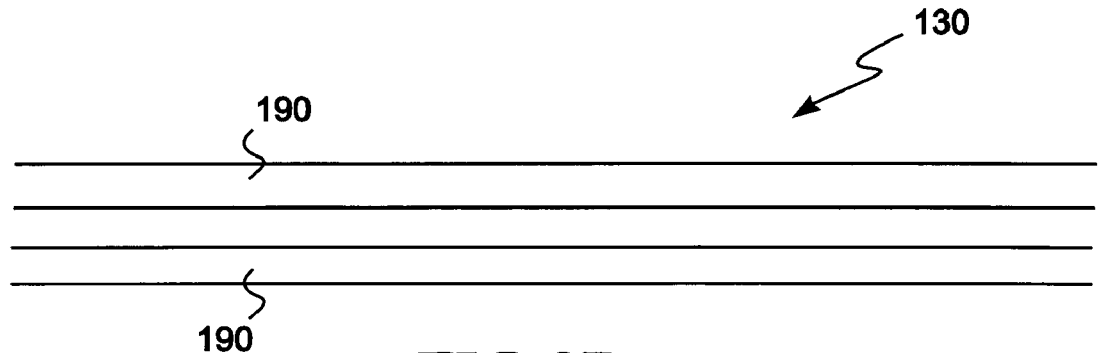
FIG. 2B is a drawing of a top view of a set of recess openings in the first structure as described in various representative embodiments.
Figure 2C:
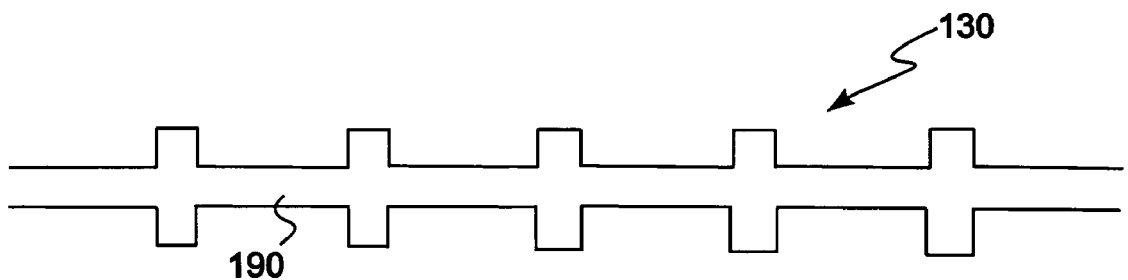
FIG. 2C is a drawing of a top view of another recess opening in the first structure as described in various representative embodiments.
Figure 2D:
FIG. 2D is a drawing of a top view of another set of recess openings in the first structure as described in various representative embodiments.
Figure 2E:
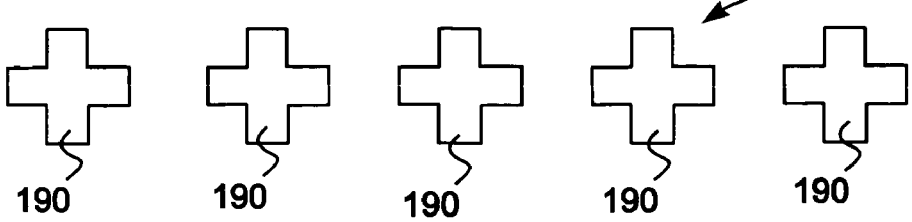
FIG. 2E is a drawing of a top view of yet another set of recess openings in the first structure as described in various representative embodiments.

FIG. 2A is a drawing of a top view of a recess opening 190 in the first structure 110 as described in various representative embodiments. FIG. 2B is a drawing of a top view of a set of recess openings 190 in the first structure 110 as described in various representative embodiments. FIG. 2C is a drawing of a top view of another recess opening 190 in the first structure 110 as described in various representative embodiments. FIG. 2D is a drawing of a top view of another set of recess openings 190 in the first structure 110 as described in various representative embodiments. FIG. 2E is a drawing of a top view of yet another set of recess openings 190 in the first structure 110 as described in various representative embodiments. The patterns of the recess openings 190 in the first structure 110 may have many different shapes and sizes as seen from FIGS. 2A-2E. The widths of the recess openings 190 are typically ⅓ to one times the depth of the recesses 130, but the widths is not limited to this situation. The example patterns of FIGS. 2A-2E are for illustrative purposes only and are not intended to be limiting.

Figure 3A:
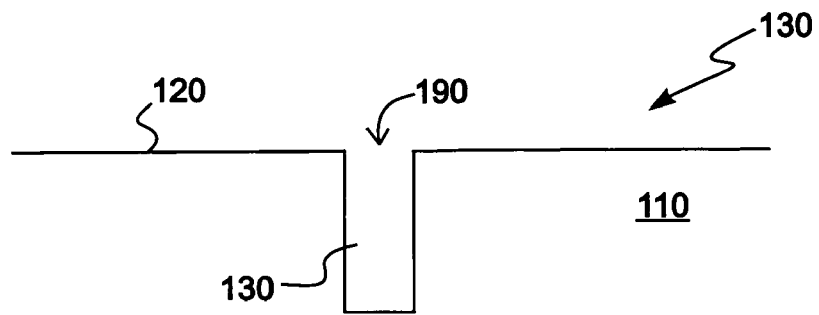
FIG. 3A is a drawing of a profile of a recess in the first structure as described in various representative embodiments.
Figure 3B:
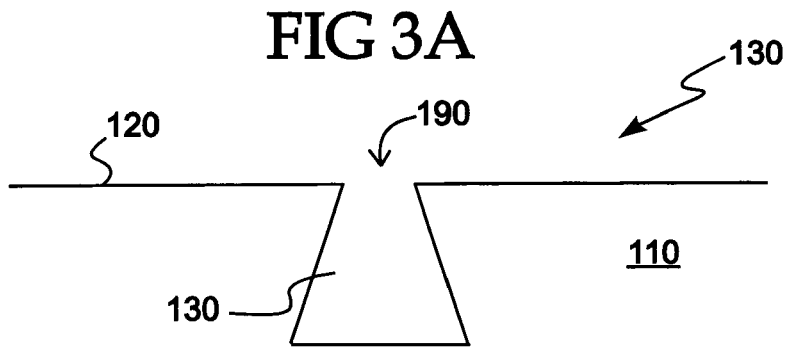
FIG. 3B is a drawing of another profile of a recess in the first structure as described in various representative embodiments.
Figure 3C:
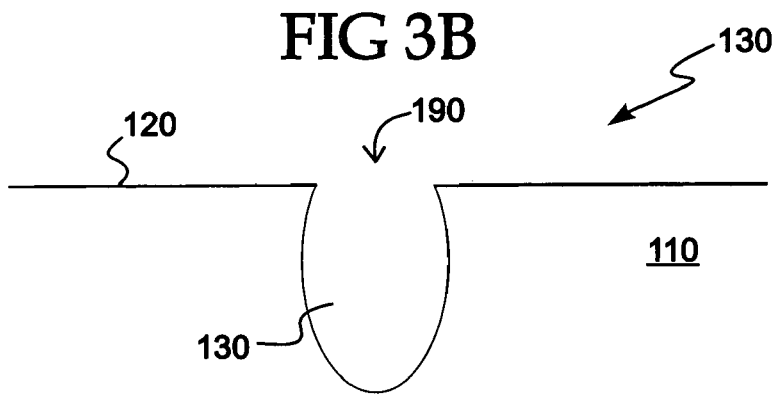
FIG. 3C is a drawing of yet another profile of a recess in the first structure as described in various representative embodiments.
Figure 3D:
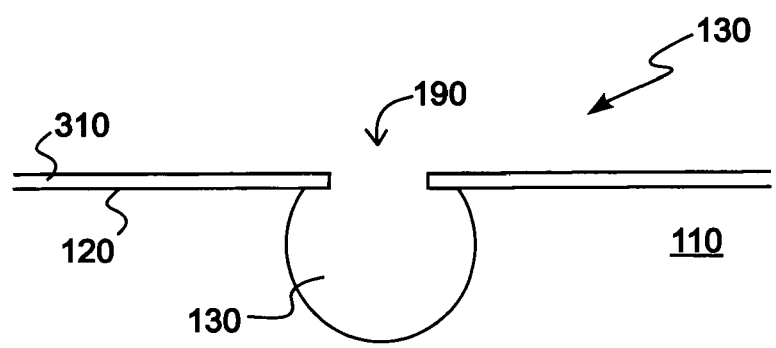
FIG. 3D is a drawing of still another profile of a recess in the first structure as described in various representative embodiments.

FIG. 3A is a drawing of a profile of a recess 130 in the first structure 110 as described in various representative embodiments. FIG. 3B is a drawing of another profile of a recess 130 in the first structure 110 as described in various representative embodiments. FIG. 3C is a drawing of yet another profile of a recess 130 in the first structure 110 as described in various representative embodiments. FIG. 3D is a drawing of still another profile of a recess 130 in the first structure 110 as described in various representative embodiments.

In FIG. 3A, the profile of the recess 130 comprises a straight etch into the first structure 110. If the first structure 110 of FIG. 3A is a silicon substrate, the recess 130 can be created by first defining the recess opening 190 using photo resist. The recess 130 is then etched using a deep silicon plasma etcher employing a Bosh process or some similar silicon etch process capable of producing a vertical etched structure in silicon with optionally roughened sidewalls to improve adhesion. The typical etch depth is about 2-3 microns.

If the first structure 110 of FIG. 3B is a silicon substrate, the recess 130 can be created by first defining the recess opening 190 using photo resist. The recess 130 is then etched using a deep silicon plasma etcher that employs a modified Bosh process wherein the coat portion of the etch-coat process is significantly short relative to the etch portion so that the sidewall coat starts to systematically break down producing a negative sloped sidewall.

If the first structure 110 of FIG. 3C is a silicon substrate, the recess 130 can be created in a silicon plasma etcher by applying an electrical bias large enough that the rate of vertical etching is greater than the lateral etch rate thereby producing a teardrop etch profile.

If the first structure 110 of FIG. 3D is a silicon substrate, the recess 130 can be created by first deposing and patterning an overlaying layer 310 which could be a dielectric such as silicon nitride, silicon dioxide, or a metal with good adhesion to silicon onto the surface. Once the recess opening 190 is opened in the overlaying layer 310, the recess 130 is created in the first structure 110 using an isotropic etch.

To obtain profiles similar to that of FIGS. 3A-3D for silicon, etching into gallium arsenide (GaAs), other III-V materials, glass, quartz, ceramic, and other materials may require other methods than those just described. The example patterns of FIGS. 2A-2E are for illustrative purposes only and are not intended to be limiting. Other profiles are also possible. Generally, the better etch profiles are those with a cavity, negatively sloped walls, or an overhanging layer of another material over the etched opening.

As just described, the surface 120 to be bonded is perforated with small, relatively shallow recesses 130 which could otherwise be described as anchor structures 130, perforations 130, channels 130, or holes 130. Generally, better adhesion will be obtained if these recesses 130 each form a small cavity 160 under the recess openings 190. When a polymer is spread onto the surface 120 of the first structure 110 or forced onto the surface 120 under pressure and elevated temperature, a small amount of the polymer flows inside these small recesses 130. When the polymer solidifies that portion which flowed into the recesses 130 and that portion of the surface 120 that is attached to the bulk of the polymer will remain firmly attached. The polymers in the recesses 130 anchor the rest of the polymer structure firmly to the first structure 110 regardless of how well they adhere to the original structure (second structure 140). The polymer anchor structure locks the polymer mass onto the surface 120. The polymer anchor structure is that portion of the polymer that flowed into the recesses 130. Lateral and vertical movement of the polymer relative to the second structure 140 is not possible without either breaking the anchor polymer structure away from the polymer mass above the anchor, or stretching and deforming the polymer structure until it pulls loose. The surface of the anchor material may also fracture. The potential of this fracture can be reduced by fabricating the recess 130 deep enough to withstand these forces. Regardless, the bond between the polymer (the second structure 140) and bonding material (the first structure 110) will be significantly stronger than without the anchor structures. Polymers such as polyimide, bisbenzocyclobutene (BCB), the photo definable polymer SU-8 manufactured by MicroChem, liquid crystal polymers (LCPs), and the like could be used for the second structure 140. Any material that can be patterned and etched with anchor patterns, such as, for example, silicon, gallium arsenide (GaAs), other III-V materials, glass, quartz, ceramic, and the like, would be appropriate for the first structure 110.

In another representative embodiment, techniques for adhering one polymer to another polymer are disclosed. Such bonding can be effected even for polymers which have inherently poor adhesion to each other. Small indentations are provided into one of the polymers for the other polymer to fill into and to grab onto. Methods disclosed include the placement of multiple stacks of liquid dispensed photo definable polymers such as polyimide, BCB, SU-8, and other appropriate materials on top of one another in different combinations while maintaining adhesion between layers. The same polymer can be layered on top of itself in different states such could be, for example, an uncured polymer layered on top of a cured polymer, as well as differing polymers. Using these techniques, advantage can be taken of each material's unique property. As an example, one material may be very strong while another material may have good adhesion to a specific surface in a particular temperature range or may have another desirable property. Materials other than photo definable polymers can also be used, as can material combinations other than two polymer layers. Two photo definable polymer layers are used, however, for illustrative purposes in the following discussion.

In representative embodiments, a first structure 110 is created on top of and attached to a base or substrate material with the first structure 110 having at least one perforation in it. A second layer of material (the second structure 140) is then placed upon the first structure 110 whereby some of the material from the second structure 140 flows into and fills up at least one perforation. The plurality of perforations acts to further hold the second structure 140 tightly to the first structure 110 regardless of the general quality of the adhesion between the two materials. The shape, size, vertical profile, and complexity of the perforations can vary depending upon the degree of adhesion desired between the two surfaces and depending upon the shape and size of the two structures 110,140. The two structures 110,140 can be of the same material or of different material. An important advantage can be realized when the two materials (first and second structures 110,140) have relatively poor adhesion to one another but both are needed for the given application. The perforations may penetrate either entirely through or partially through the first structure 110. The perforations can also be created in the surface 120 of the first structure 110 by photo definition of photo definable polymers, etching techniques, laser abrasion or other appropriate technique.

Figure 4A:
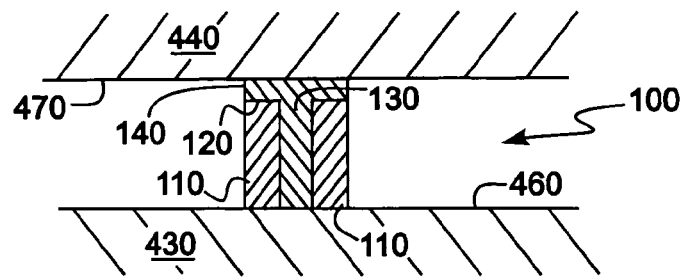
FIG. 4A is a drawing of another attachment system as described in various representative embodiments.

FIG. 4A is a drawing of another attachment system 100 as described in various representative embodiments. In FIG. 4A, the attachment system 100, comprises a first structure 110 which has a surface 120 and a recess 130 in the surface 120 and a second structure 140 which is formed into the recess 130 and which extends above the surface 120. The first structure 110 is adhered to a third structure 430, also referred to herein as a lower substrate 430, at a second surface 460, also referred to herein as a lower substrate surface 460, of the third structure 430. Also in FIG. 4A, a fourth structure 440, also referred to herein as an upper substrate 440, is attached to the second structure 140 at a third surface 470, also referred to herein as an upper substrate surface 470.

The third structure 430 (lower substrate 430) could be a semiconductor substrate such as, for example, silicon, gallium arsenide (GaAs), other III-V compounds, or the like. Alternatively, the third structure 430 could be, glass, quartz, ceramic, or other appropriate material. The fourth structure 440 (upper substrate 440) could be a semiconductor substrate such as, for example, silicon, gallium arsenide (GaAs), other III-V compounds, or the like. Alternatively, the fourth structure 440 could be, glass, quartz, ceramic, or other appropriate material. The first structure 110 could be a polymer or other appropriate material which like polymers have a glass transition temperature wherein for at least one temperature greater than the glass transition temperature the first structure 110 is in a deformable state and for at least one temperature less than the glass transition temperature, the first structure 110 is in a rigid state. Further, the first structure 110 could be a material which is photo-definable or definable via a photoresist/etch process and which could be applied to the third structure 430 in the liquid state. In other applications, the first structure 110 could be any material which is adherent either with or without special surface preparation and/or adhesion promoters to the third structure 430. The second structure 140 could be a polymer or other appropriate material which like polymers have a glass transition temperature wherein for at least one temperature greater than the glass transition temperature the second structure 140 is in a deformable state and for at least one temperature less than the glass transition temperature, the second structure 140 is in a rigid state. Further, the second structure 140 could be a material which is photo-definable or definable via a photoresist/etch process and which could be applied in the liquid state to the first structure 110 or to the combination of the first structure 110 and the third structure 430.

Figure 4B:
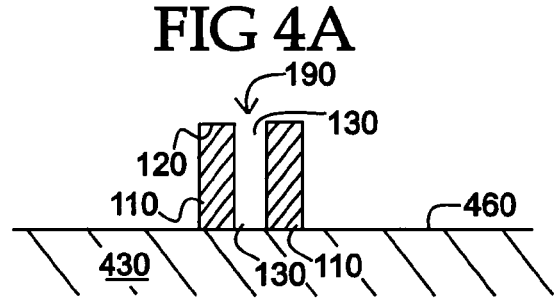
FIG. 4B is a drawing at a stage in another fabrication of the attachment system as described in various representative embodiments.

FIG. 4B is a drawing at a stage in another fabrication of the attachment system 100 as described in various representative embodiments. Standard integrated circuit processing procedures can be used in the fabrication process. In a representative embodiment, in obtaining the structure of FIG. 4B, the first structure 110 was applied to the third structure 430 in liquid or other form and then photo patterned forming an opening 190 for photo definable polymers. As necessary, the first structure 110 is then cured at a curing temperature to harden it.

Figure 4C:
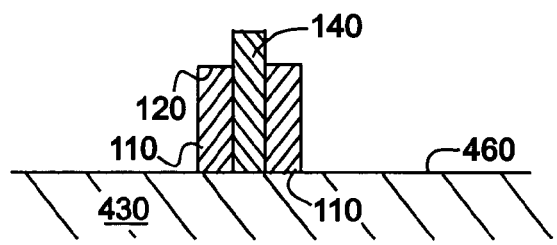
FIG. 4C is a drawing at another stage in the fabrication of the attachment system as described in various representative embodiments.
Figure 4D:
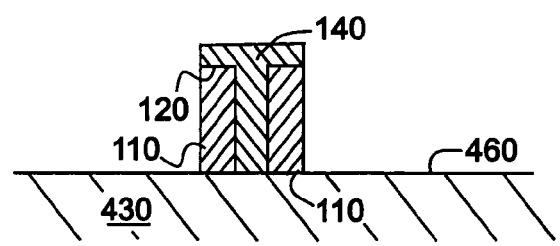
FIG. 4D is a drawing at an alternative stage in the fabrication of the attachment system as described in various representative embodiments.

FIG. 4C is a drawing at another stage in the fabrication of the attachment system 100 as described in various representative embodiments. Standard integrated circuit processing procedures can be used in the fabrication process. In a representative embodiment, in obtaining the structure of FIG. 4C, the second structure 140 was applied to the first and the third structures 110,430 in liquid or other form and then photo patterned forming a second structure 140 for photo definable polymers leaving the second structure 140 approximately as shown in FIG. 4C or as shown in FIG. 4D. Typically the second structure 140 is patterned such that the second structure 140 overlays the top of the walls of the first structure 110 within 50% in the case of the first structure 110 being polyimide and the second structure 140 being BCB. FIG. 4D is a drawing at an alternative stage in the fabrication of the attachment system 100 as described in various representative embodiments.

Figure 4E:
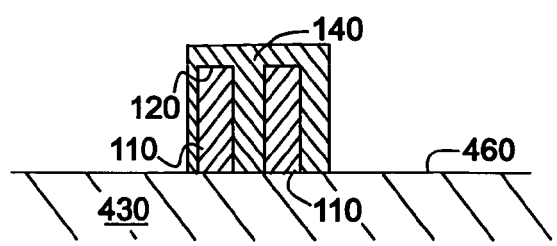
FIG. 4E is a drawing at another alternative stage in the fabrication of the attachment system as described in various representative embodiments.

FIG. 4E is a drawing at another alternative stage in the fabrication of the attachment system 100 as described in various representative embodiments. In FIG. 4E, the sandwiched layer (second structure 140) can optionally extend out laterally where it protrudes at the top to cover a certain amount of the first and second surfaces 120,460 of the first and the third structures 110,430 for those applications wherein a larger contact area is required or for ease of processing.

Following the actions resulting in the configuration of FIG. 4D, the fourth structure 440 (the upper substrate 440) is attached to the second structure 140. This attachment may include increasing the temperature above the glass transition temperature of the second structure 140 to bond to the upper substrate 440 and cure the second structure 140. The result of these steps is as shown in FIG. 4A.

Figure 5:
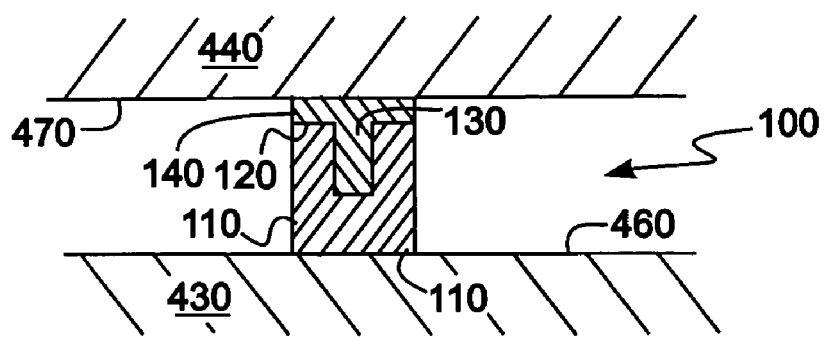
FIG. 5 is a drawing of the attachment system of FIG. 4A.
Figure 6:
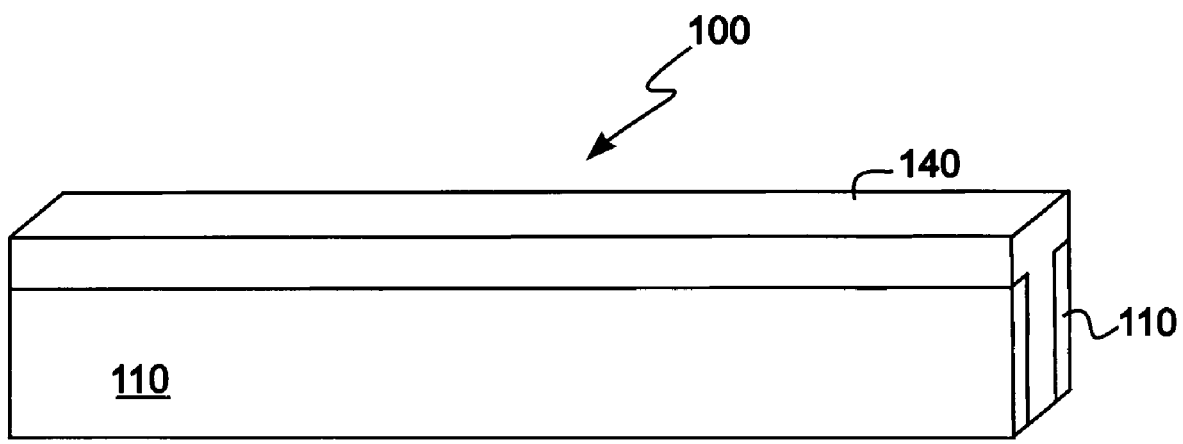
FIG. 6 is a perspective drawing of the attachment system of FIG. 4A.

FIG. 5 is a drawing of the attachment system 100 of FIG. 4A. In contrast to FIG. 4A, the recess 130 in FIG. 5 extends only partially into the first structure 110, not all the way to the lower substrate surface 460. FIG. 6 is a perspective drawing of the attachment system 100 of FIG. 4A. While the representative example of FIG. 5 shows the filled recess 130 as having long, narrow, straight, parallel, and vertical walls this is not a condition of the present teachings and the filled recesses 130 are not so limited.

In a representative example which illustrates a particular application of the present teachings, the first structure 110 comprises a strong polymer which cures at a high temperature combined with a second structure 140 which comprises another polymer having a lower curing temperature to form a bondable adhesive structure. In this example the polymer of the second structure 140 typically has poor adhesion to the polymer of the first structure 110. In this representative example, integrated circuit die from two semiconductor wafers are joined with narrow walls of polymers which encircle and provide protection to delicate circuits leaving a space between the two die so that the joining of the mating dies do not interact and cause degradation in performance. In this example a first layer polyimide (first structure 110) is constructed onto a top or lid wafer (third structure 430) 430 that can withstand the high curing temperatures of polyimide and is used as a gasket or spacer. Then a second layer (second structure 140) comprising BCB is placed on top of the cured polyimide gasket (first structure 110) and left uncured. This second layer comprising BCB has lower glass transition and cure temperatures than polyimide and will not damage the temperature sensitive devices on a second or device wafer (fourth structure) 440. The top or lid wafer (third structure) 430 is aligned die-to-die with the device wafer (fourth structure) 440 whose surface has been properly prepared to bond to BCB. The device wafer 440 is then thermal compressively bonded in using a wafer bonding tool. A moderate temperature is applied above the BCB glass transition temperature but at a safe enough level for the fragile devices on the device wafer (fourth structure) 440. The uncured BCB acts as a thermal set glue to adhere to the device wafer 440. The BCB can then be cured at a much lower temperature than polyimide to harden. Thus, a high strength, high temperature polyimide gasket can be bonded to a temperature sensitive device wafer 440 using BCB as the adhesive which is then cured at a temperature not detrimental to the sensitive devices on the device wafer 440. For this example, a problem exists because the BCB has very poor adhesion to polyimide. This problem can be alleviated by creating one or more recesses 130 into which the BCB can flow as discussed above.

Thus, a gasket is created which consists of a pair of closely spaced walls which can run in parallel and which form a cured polyimide gasket structure on one of the surfaces. Sandwiched in between these two walls is a wall of uncured BCB at a height protruding above the two polyimide walls to act as the adhesive. The slot between the two walls of polyimide act to hold the BCB firmly to the polyimide which would otherwise easily break loose. The frictional and other forces hold the BCB in place in both the horizontal and vertical planes and provide increased surface area for these forces to act. The BCB acts as a thermal set glue which adheres to the surface of another wafer after proper preparation of the surface and thermal compression bonding. Alternatively, the surface of the other wafer (device wafer 440) could incorporate anchor etched structures (recesses 130*a*) to further enhance adhesion. The BCB will squeeze down and outward to a certain degree after compressing. The bonding temperature should be above the glass transition of the uncured BCB so that it will be in a fluid-plastic state but below that of the cured polyimide which must remain ridged. The BCB is then cured. The polyimide walls act as a rigid and strong support structure as well as a spacer to keep the distance between the two surfaces fixed. The BCB cures at a relatively low temperature bonding the second wafer to the polyimide structure.

The two cured polyimide sidewalls provide a strong, ridged structure which acts as a spacer to keep the two wafers separated. The two polyimide sidewalls also act to lock the BCB firmly in place so that the BCB, which normally has very poor adhesion to polyimide, will remain firmly attached. This double sidewall structure does not have to be continuous. It can be a solid single sidewall pair with a layer of BCB on top for varying distances which can be interspersed with the sandwich structure or other appropriate structures.

The teachings above provide an added advantage. The curing of polymers is a chemical reaction which produces byproducts such as water vapor and various other emitted chemicals. In the preceding example, if a single uncured polymer were to serve as both a gasket and an adhesive and the wafers were bonded together, the byproducts of the curing process would then be trapped inside the cavity formed by the gasket. The trapping of these byproducts could lead to the determent of the devices inside. Pressure may build up from the byproduct gasses trapped inside the cavities formed by the gasket while at cure temperatures causing failures of the gasket or causing the bonded wafers to separate. By pre-curing the gasket prior to bonding and using just enough BCB to act as a glue such as illustrated in FIG. 4C and FIG. 4D, very little in the way of additional gaseous byproducts will be generated inside the enclosed cavity since the walls of the gasket have previously been cured. In this manner, a large number of combinations of materials can be bonded together.

Figure 7:
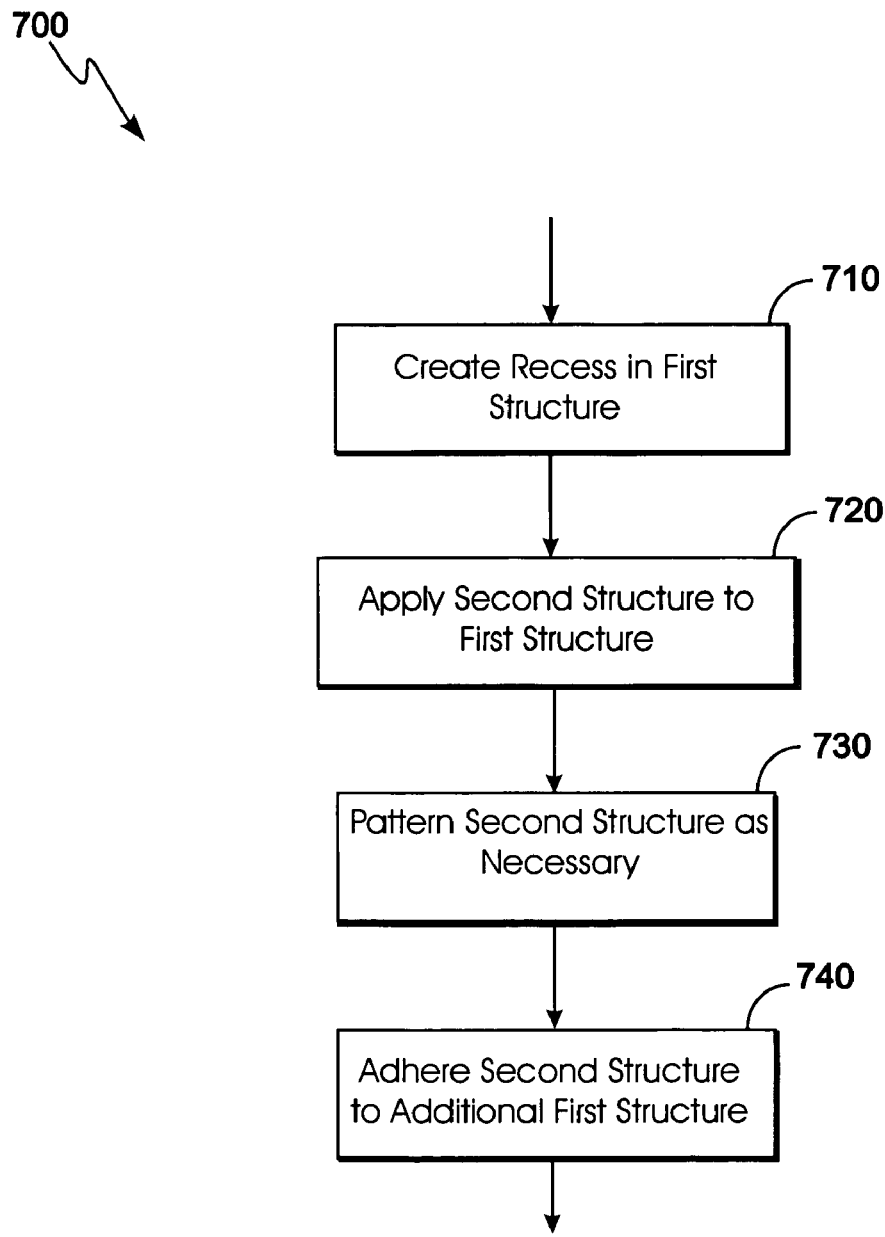
FIG. 7 is a drawing of a flow chart of a method for creating an attachment system as described in various representative embodiments.

FIG. 7 is a drawing of a flow chart of a method 700 for creating an attachment system 100 as described in various representative embodiments. In the representative embodiment of FIG. 7, the attachment system 100 could use any material which can be patterned and etched such as, for example, silicon, GaAs and other III-V materials, glass, quartz, ceramic, and the like for the first structure 110. In block 710, a recess 130 is created in the first structure 110. Standard integrated circuit processing procedures can be used in the fabrication process. In creating the recess 130, an opening 190 is opened in an etch resistant layer 180 which could be a photoresist layer 180 which was previously spun onto the first structure 110, exposed using an appropriately patterned mask, and developed. The recess 130 is created in the first structure 110 through the opening 190. With the photoresist layer 180 remaining on the surface 120 of the first structure 110, a deep silicon etching process which could be, for example, the Bosch process is used to etch the recess 130 for applications in which the first structure 110 is a silicon substrate. The etching process can be optionally changed, for example, to that of an isotropic etch. This optional, additional etch balloons out at the bottom of the recess 130 creating the cavity 160. The extension of the recess 130 into the first structure 110 beyond the projection 191 normal to the surface 120 of recess opening 190 is optional but will improve the strength of the attachment of the second structure 140 to the first structure 110. The photo resist is then removed exposing the surface 120 of the first structure 110. Block 710 then transfers control to block 720.

In block 720, the second structure 140 is applied to the first structure 110. The second structure 140 is typically a polymer which can be coated onto the surface 120 in liquid or semi-liquid form. For applications wherein the first structure 110 is located on a substrate comprising multiple chips or separate devices, the second structure 140 can be either locally applied or applied the extent of the substrate. Block 720 then transfers control to block 730.

In block 730, the second structure 140 is patterned as necessary by photo defining the structure when using a photo definable polymer. Block 730 then transfers control to block 740.

In block 740, the second structure 140 is adhered to the additional first structure 110*a*. In this process, the second structure 140 can be pressed onto the surface 120*a* of the additional first structure 110*a* at elevated temperature. The polymer of the second structure 140 is heated above its glass transition temperature and thus is in a fluid state allowing it to flow into and mold to the previously etched recess 130*a* of the additional first structure 110*a* which includes the cavity 160*a* if present. Block 740 then terminates the process.

Figure 8:
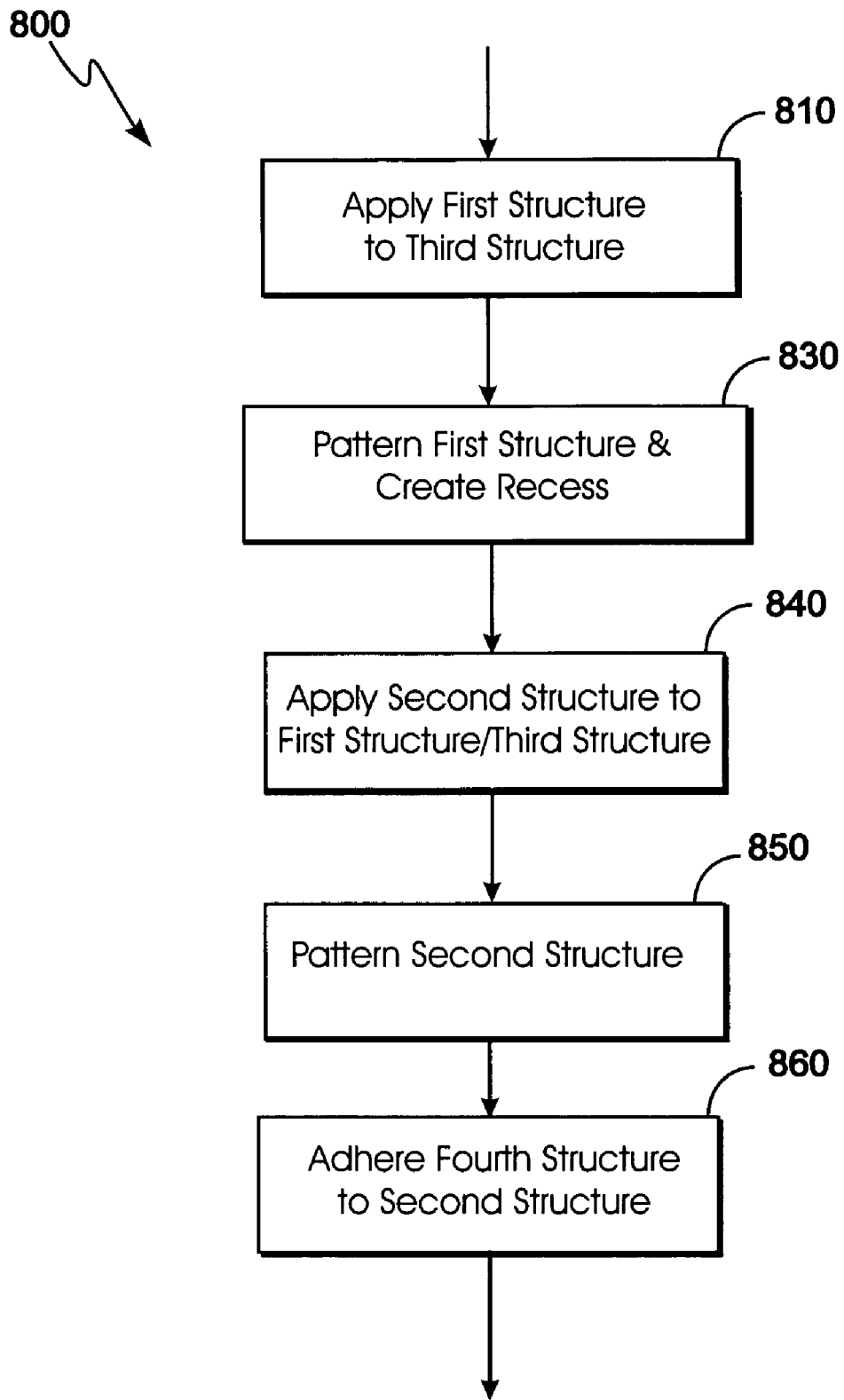
FIG. 8 is a drawing of a flow chart of another method for creating an attachment system as described in various representative embodiments.

FIG. 8 is a drawing of a flow chart of another method 800 for creating an attachment system 100 as described in various representative embodiments. In the representative embodiment of FIG. 8, the attachment system 100 could use any material such as, for example, silicon, GaAs and other III-V materials, glass, quartz, ceramic, and the like for the third structure 430. In block 810, the first structure 110 is applied to the third structure 430. The first structure 110 is typically a photo definable polymer which can be coated onto the third structure 430 in liquid or semi-liquid form. For applications wherein the third structure 430 is located on a substrate comprising multiple chips or separate devices, the first structure 110 can be either locally applied or applied the extent of the substrate. Block 810 then transfers control to block 830.

In block 830, the first structure 110 is patterned as necessary by photo defining the structure when using a photo definable polymer creating an opening 190 into the first structure 110. The recess 130 is created in the first structure 110 through the opening 190. First structure 110 is optionally cured at elevated temperature to harden. Block 830 then transfers control to block 840.

In block 840, the second structure 140 is applied to the first structure 110 and any exposed parts of the third structure 430. The second structure 140 is typically a polymer which can be coated onto the first structure 110 and exposed parts of the third structure 430 in liquid or semi-liquid form. For applications wherein the third structure 430 is located on a substrate comprising multiple chips or separate devices, the second structure 140 can be either locally applied or applied the extent of the substrate. Block 840 then transfers control to block 850.

In block 850, the second structure 140 is patterned as necessary by photo defining the structure when using a photo definable polymer. Block 850 then transfers control to block 860.

In block 860, the second structure 140 is adhered to the fourth structure 440. The second structure 140 can be pressed onto the fourth structure 440 at elevated temperature. The polymer of the second structure 140 is heated above its glass transition temperature and thus is in a plastic state allowing it to flow onto and bound to the fourth structure 440. Second structure 140 is optionally cured at elevated temperature. Block 860 then terminates the process.

In representative embodiments, attachment systems 100 have been disclosed which provide enhanced adhesion to various structures and which can be used to protect circuitry from the high temperatures and gasses created during the curing of various polymers often used in wafer-to-wafer bonding.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An attachment system, comprising:
   a first substrate having a surface and a recess, the recess extending from an opening in the surface and terminating in a cavity located inside the first substrate, the opening comprising a first rectangular portion that is intersected by a second rectangular portion;
   a polymer structure with a first portion molded into the recess and the cavity of the first substrate, and a second portion extending above the surface of the first structure, wherein the first portion contained inside the recess and the cavity is operative to anchor the polymer structure to the first substrate, the polymer structure characterized by a glass transition temperature that defines a transition of the polymer from a deformable state to a rigid state during attachment of the polymer structure to the first substrate; and
   a second substrate and a second substrate having a surface and a recess, wherein a third portion of the polymer structure is molded into the recess of the second substrate, thereby anchoring the polymer structure to the second substrate.

2. The attachment system as recited in claim 1, wherein the first substrate is a semiconductor substrate.

3. The attachment system as recited in claim 1, wherein the material of the first substrate is selected from the group consisting of silicon, gallium arsenide (GaAs), other III-V materials, glass, quartz, and ceramic.

4. The attachment system as recited in claim 1, wherein the recess in the first substrate further comprises a neck extending from the opening at the surface of the first substrate to the cavity located inside the first structure, and further wherein the cavity has a substantially circular cross-section.

5. The attachment system as recited in claim 1, wherein the opening further comprises a third rectangular portion that intersects the first rectangular portion.

6. The attachment system as recited in claim 1, wherein the first rectangular portion is configured as a longitudinal channel in the first substrate with the second rectangular portion orthogonally intersecting the longitudinal channel.

7. An attachment system comprising:
   a first substrate that includes a recess originating from an opening in a surface of the first substrate, the recess comprising a first recess portion located below the surface, the first recess portion having a first width that is greater than a second width corresponding to the opening in the surface;
   a polymer structure comprising a material characterized by a glass transition temperature that defines a transition of the material from a deformable state at to a rigid state, the material occupying at least a portion of the recess in the first substrate thereby anchoring the polymer structure to the first substrate; and
   a second substrate that includes a recess, wherein the polymer structure is further molded into at least a portion of the recess in the second substrate, thereby anchoring the polymer structure to the second substrate as well.

8. The attachment system as recited in claim 7, wherein the first recess portion has a circular cross-section as viewed parallel to the surface of the first substrate, and wherein the first width corresponds to a diameter of the circular cross-section.

9. The attachment system as recited in claim 7, wherein the first recess portion is part of a curved sidewall of the recess.

10. The attachment system as recited in claim 7, wherein the recess in the first substrate has a teardrop profile.

11. The attachment system as recited in claim 7, wherein the opening is configured as a rectangular opening.

12. The attachment system as recited in claim 11, wherein the rectangular opening is further configured as a longitudinal channel in the first substrate.

13. The attachment system as recited in claim 7, wherein the opening comprises a first rectangular portion that is intersected by a second rectangular portion.

14. The attachment system as recited in claim 13, wherein the first rectangular portion is configured as a longitudinal channel in the first substrate, and wherein the longitudinal channel is intersected by the second rectangular portion.

* * * * *

UNITED STATES PATENT AND TRADEMARK OFFICE
CERTIFICATE OF CORRECTION

| | | |
|---|---|---|
| PATENT NO. | : 7,554,177 B2 | Page 1 of 1 |
| APPLICATION NO. | : 11/243569 | |
| DATED | : June 30, 2009 | |
| INVENTOR(S) | : Frank S Geefay et al. | |

It is certified that error appears in the above-identified patent and that said Letters Patent is hereby corrected as shown below:

Column 12, Line 5, Claim 1, after "substrate" delete "and a second substrate".

Column 12, Line 37, Claim 7, after "state" delete "at".

Signed and Sealed this
Twenty-fifth Day of September, 2012

David J. Kappos
*Director of the United States Patent and Trademark Office*